United States Patent [19]

Wisnosky et al.

[11] 4,397,940
[45] Aug. 9, 1983

[54] REDUCING THE LIQUID SOLVENT DEVELOPMENT TIME OF A POLYMERIC RELIEF IMAGE

[75] Inventors: Jerome D. Wisnosky; Doris F. Carlson, both of Lancaster, Pa.

[73] Assignee: Armstrong World Industries, Inc., Lancaster, Pa.

[21] Appl. No.: 392,647

[22] Filed: Jun. 28, 1982

[51] Int. Cl.$^3$ .................. B44C 1/22; C03C 15/00; C03C 25/06; B29C 17/08
[52] U.S. Cl. .................................. 430/325; 156/646; 156/651; 156/654; 156/668; 427/43.1; 430/434
[58] Field of Search ............... 156/643, 646, 651, 654, 156/655, 668; 430/149, 150, 294, 325, 434, 435, 436; 427/43.1, 264, 270, 271, 273

[56] References Cited

U.S. PATENT DOCUMENTS

| | | | |
|---|---|---|---|
| 2,732,286 | 1/1956 | Propstl | 156/646 |
| 3,794,487 | 2/1974 | Rohrig et al. | 430/150 |
| 3,824,137 | 7/1974 | Bok et al. | 156/638 |

*Primary Examiner*—William A. Powell

[57] ABSTRACT

The present invention contemplates a method to reduce the liquid solvent contact time required to develop a latent polymeric relief image in a layer of polymeric material that is selectively exposed to radiation so that there is formed a layer having exposed and unexposed areas. In the method of the present invention, the layer is exposed to the gaseous vapors of at least one solvent for the more soluble area, after which it is contacted with a liquid solvent which preferentially dissolves the material from the more soluble area and which does not affect the polymerized material which forms the relief image.

10 Claims, No Drawings

REDUCING THE LIQUID SOLVENT DEVELOPMENT TIME OF A POLYMERIC RELIEF IMAGE

BACKGROUND OF THE INVENTION

This invention relates to a method for developing a latent relief image in a photoresist material that has been selectively exposed to radiant energy.

Negative and positive photoresist systems are well known in the art. Simply put, a negative photoresist basically consists of polymerizable material which, when exposed to radiant energy, will polymerize to form a hard sheet. It is well known to cover a substrate with a layer of a negative photoresist material which can be polymerized with radiant energy and then expose selected areas, such as by exposing image-wise through a mask, of the covering material to radiant energy to thereby form a surface that has areas of polymerized and unpolymerized material. This technique creates what is known in the art as a latent image. A relief image is then formed by eluting the layer with a solvent that preferentially dissolves the unpolymerized areas of the layer. Typically, this is achieved by spray washing the layer with a solvent for the unpolymerized material.

In a positive photoresist system, those areas that have been exposed to radiant energy will become more soluble in a selected solvent after exposure. The exposed areas are then preferentially dissolved with a liquid solvent, again such as by being spray washed.

In essence, therefore, in a negative photoresist system the unexposed areas are dissolved, and in a positive photoresist system the exposed areas are dissolved, by selected liquid solvent systems.

Such methods of forming a latent image and subsequently removing selected material by solvent spray washing is in wide commercial use. There are, however, some disadvantages associated with the solvent spray wash removal technique and, indeed, any solvent liquid wash removal technique. Such techniques are typically cumbersome processes that do not always lend themselves to a large scale production facility. Furthermore, large amounts of solvent material are used in such processes. These solvents, especially those that are used with negative photoresist systems, are generally organic materials which are typically very expensive and, furthermore, disposal of spent solvents is often very difficult and costly.

In negative photoresists, such problems are magnified when the layer containing the polymerizable material is stored for any length of time, especially when the material is of the kind that contains a carrier solvent. Such polymerized material, when first laid down on a film, is tacky. Such tackiness can be attributed to the material's carrier solvent. Over time, the solvent will evaporate and the polymerizable material will harden and will subsequently be more difficult to remove by liquid solvent wash. This aging effect may be less pronounced in positive photoresist systems.

It would be advantageous, therefore, to have a method of substantially reducing the amount of time devoted to the solvent spray washing step without deteriorating the developed latent image.

DESCRIPTION OF THE INVENTION

The present invention contemplates utilizing a gaseous vapor exposure stage, prior to the standard liquid solvent wash stage, in the removal of soluble polymeric material from a layer that consists of soluble and insoluble polymeric areas to thereby form a polymeric relief image. In this vapor exposure stage, the layer will be exposed to the vapors of a solvent for the soluble polymeric material. By utilizing this vapor exposure stage, the amount of time that the layer must be subsequently exposed to a liquid solvent wash will be considerably lessened.

Although the method of the present invention is primarily directed to shortening the removal time, via a liquid solvent system, of the soluble areas of negative and positive photoresists that have been selectively exposed to radiant energy, it is understood that this method may be utilized on any layer that has areas that are soluble and areas that are insoluble with regard to a specific liquid solvent wash system, irregardless of the technique by which the layer was differentially solubilized.

Any solvent, or combination of solvents for the soluble material that has a vapor pressure at room temperature may be employed in the process of the present invention. For example, when the material is a photopolymerizable negative photoresist, organic solvents, such as, for example, acetone, toulene, and haloalkanes, may be employed.

For positive photoresists (for example, a dichromated colloid/water insoluble resin mixture) a basic gaseous solvent such as ammonia may be used. For a positive photoresist system in which the radiant-energy exposed areas are subject to photodecrosslinking, a wide range of organic solvents could be utilized for the exposed areas. In any event, the specific gaseous vapor and liquid solvent wash systems utilized will depend on the needs of the individual practitioner of the invention, the characteristics of the soluble area and the mechanisms of the particular photoresist that is utilized.

The same solvent may or may not be used in the vapor exposure stage as is used in the liquid solvent wash stage.

The terms "soluble material" and/or "soluble areas" are used in the present specification and claims in reference to those areas and materials on the layer that are preferentially dissolved and subsequently removed by the liquid solvent wash. Specifically, in a negative photoresist system these terms refer to the unexposed regions of the layer. Accordingly, the terms "insoluble material" and/or "insoluble areas" as used herein refer, in a negative photoresist system, to those regions which are exposed to radiant energy and are thereby substantially insoluble in the gaseous vapor and liquid solvent systems utilized in the process of the present invention. By contrast, in a positive photoresist system the terms "insoluble material" and/or "insoluble areas" as used herein, refer to those regions on the layer that have not been exposed to radiant energy. Therefore, in a positive photoresist system the terms "soluble areas" and/or "soluble materials" as used herein refer to those regions on the layer that have been exposed to radiant energy and are thereby rendered soluble in specific gaseous solvent vapor and liquid solvent systems.

The term "differentially solubilize" is used herein in reference to a procedure whereby a homogeneous layer of polymeric material is transformed, such as by being selectively exposed to radiant energy, such as by an image-wise exposure through a mask, to thereby produce a layer that has areas that are soluble and other areas that are insoluble in selected liquid solvent systems.

The length of time that the layer (or material) is exposed to the gaseous solvent vapor will depend on such factors as the photoresist chemistry and film thickness, the particular solvent being employed, the concentration of the vapors, and the needs of the individual practitioner of the invention. Vapor exposure times of only a few seconds may serve to lessen the time that the material has to be exposed to the liquid solvent wash. By contrast, if the material is exposed to a very active solvent for an extended period of time, not only will the soluble areas be dissolved, but the adhesion between the insoluble regions and the substrate may be affected. Although the insoluble areas will remain substantially undissolved, they may separate from the substrate and the relief effect will subsequently be destroyed.

The gaseous vapor exposure stage will, by necessity, take place in any chamber in which the vapors will not dissipate. Thus, the concentration of the vapors will depend to a great part on the dimensions of the chamber that is utilized and the temperature within the chamber since vapor pressures will generally increase with an increase in temperature.

With regard to the needs of the individual practitioner of this invention, the vapor chamber may be incorporated into, for example, (as in the case of flat sheet goods) a production line wherein the exposure time will be dependent on factors such as the length of the vapor chamber and the speed of the line.

It is again understood that the process described herein for removing material from a layer that contains soluble and insoluble areas is not dependent on the method by which the polymerized areas were in fact produced. Typically, however, such materials are differentially solubilized by a patterned exposure to radiant energy, such as UV, visible light, X-ray or electron beam radiation. Such exposure to radiant energy is generally done image-wise through a mask or grid to thereby selectively form a pattern of exposed and unexposed areas on the layer.

EXAMPLES

In all of these examples, an approximately 8 mil thick, negative resist photoreactive coating, which is a mixture of a polymethylmethacrylate and an active acrylate in a toulene carrier solvent, was applied by draw down bar to an aluminum or glass substrate. The coating was then aged for 30 days under ambient conditions by which time the carrier solvent had substantially evaporated. The coating was then selectively exposed, through a latent-image mask, (ITEK USAF 1951 Resolution Chart, STR 702.111, negative image type) to UV radiation (using an Opti Beam 1000, 0.01 W/cm$^2$, 360 seconds exposure time) to thereby form a coating that has patterned unreacted and reacted areas.

Samples of the irradiated material were then exposed to gaseous solvent vapors for a duration of from 1 minute to 20 minutes, after which the material was liquid spray developed. The amount of time needed to spray develop each sample was noted. As a control, a sample was spray developed without having the benefit of the gaseous solvent vapor exposure step. The thickness of the samples and the control were then noted to determine if there was erosion of thickness in the less soluble regions.

The quality of the developed images were then determined by examining each of five bar groups as indicated on the ITEK resolution mask. Each group consisted of six elements, each element having three bars that had the following dimension range:

| GROUP NO. | BAR/SPACE WIDTH-RANGE (MILS)* FOR EACH SIX-ELEMENT GROUP |
|---|---|
| 0 | 12–20 |
| 1 | 6–11 |
| 2 | 2.8–5 |
| 3 | 1.4–2.4 |
| 4 | 0.8–1.2 |
| 5 | 0.35–0.7 |

*Approximate Values

The quality of the developed image in each group was subjectively determined as being either excellent, good, fair or poor according to the following criteria:

| | |
|---|---|
| Excellent (EX) | Bar edge sharp, bar surface smooth |
| Good | Bar edge sharp, pitting of bar surface detected |
| Fair | Loss of bar edge definition, surface erosion evident |
| Poor | Bars eroded overall |

In all examples, 1,1,1 trichloroethane was used both in the gaseous vapor exposure stage and in the liquid spray development unit. The spray unit was a single nozzle fan-shaped spray operating at approximately 35 psi.

The data from the Examples and the control is set forth in the Table below:

| Example | Vapor Exposure Time (minutes) | Time to Spray Develop (secs.) | Thickness After Development (mils) | RESOLUTION QUALITY OF GROUP NO. | | | | | |
|---|---|---|---|---|---|---|---|---|---|
| | | | | 0 | 1 | 2 | 3 | 4 | 5 |
| "Control" | — | 450 | 8 | EX | EX | EX | Good | Good to Fair | Poor |
| 1 | 1.0 | 390 | 8 | EX | EX | Good | Good | Fair to Poor | Poor |
| 2 | 2.5 | 165 | 8 | EX | EX | EX | Good | Fair | Poor |
| 3 | 5.0 | 140 | 6.5 | EX | EX | EX | Good | Fair | Poor |
| 4 | 10.0 | 100 | 8.0 | EX | EX | EX | Good | Fair | Poor |
| 5 | 15.0 | 50.0 | 6.0 | EX | EX | Good | Fair | Poor | Poor |
| 6 | 20.0 | 25.0 | 4.0 | EX | EX | EX | EX | Fair to Poor | Poor |

This data indicates that by using the vapor exposure step, the liquid spray development time can be shortened considerably without having any substantial deterioration in the overall relief image.

What is claimed is:

1. A method for forming a polymeric relief image in a layer that comprises areas of soluble and insoluble material, which method comprises:
   (a) exposing the layer to the vapors of at least one solvent for the soluble material; and
   (b) contacting the vapor exposed layer with a liquid solvent which preferentially dissolves the soluble material and which does not affect the insoluble material to thereby form a polymeric relief image.

2. The method of claim 1 wherein, in step (b), the liquid solvent is sprayed onto the layer.

3. The method of claim 1 wherein the material is differentially solubilized by an image-wise exposure to radiant energy through a mask.

4. The method of claim 3 in which the material is a negative photoresist.

5. The method of claim 3 in which the material is a positive photoresist.

6. An apparatus for forming a polymeric relief image in a layer that comprises areas of soluble and insoluble material, which apparatus comprises:
   (a) means for exposing the layer to the vapors of at least one solvent for the soluble material; and
   (b) means for contacting the vapor exposed layer with a liquid solvent which preferentially dissolves the soluble material and which does not affect the insoluble material to thereby form a polymeric relief image.

7. The apparatus of claim 6 wherein the means for contacting the vapor exposed layer with a liquid solvent is a liquid solvent spray means.

8. The apparatus of claim 6 wherein the material is differentially solubilized by an image-wise exposure to radiant energy through a mask.

9. The apparatus of claim 8 in which the material is a negative photoresist.

10. The apparatus of claim 8 in which the material is a positive photoresist.

* * * * *